United States Patent
Baranwal et al.

(10) Patent No.: US 9,484,913 B2
(45) Date of Patent: Nov. 1, 2016

(54) EMULATION OF LED INPUT CHARACTERISTICS IN BICMOS PROCESS

(71) Applicant: TEXAS INSTRUMENTS INCORPORATED, Dallas, TX (US)

(72) Inventors: Shailendra K. Baranwal, Murphy, TX (US); David W. Stout, Lewisville, TX (US); Abhijeeth A. Premanath, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/642,382

(22) Filed: Mar. 9, 2015

(65) Prior Publication Data

US 2015/0326223 A1    Nov. 12, 2015

Related U.S. Application Data

(60) Provisional application No. 61/951,235, filed on Mar. 11, 2014.

(51) Int. Cl.
| | |
|---|---|
| *H03K 17/78* | (2006.01) |
| *H03K 17/689* | (2006.01) |
| *H03K 17/567* | (2006.01) |
| *H03K 17/16* | (2006.01) |
| *H04L 25/02* | (2006.01) |

(52) U.S. Cl.
CPC .......... *H03K 17/689* (2013.01); *H03K 17/162* (2013.01); *H03K 17/168* (2013.01); *H03K 17/567* (2013.01); *H04L 25/0266* (2013.01)

(58) Field of Classification Search
CPC ............... H03K 17/689; H03K 17/78; H03K 17/7955; H04B 10/801; H04B 10/802; H01L 31/16; H01L 31/167

USPC ................ 327/387, 368, 365, 509, 514–516; 250/551

See application file for complete search history.

(56) References Cited

U.S. PATENT DOCUMENTS

| | | | | |
|---|---|---|---|---|
| 6,060,943 A | * | 5/2000 | Jansen ................. | H03K 17/063 327/493 |
| 6,469,564 B1 | * | 10/2002 | Jansen ..................... | G06G 7/62 327/365 |
| 6,518,731 B2 | * | 2/2003 | Thomas ................. | H02H 9/042 320/135 |
| 7,379,282 B1 | * | 5/2008 | Zansky ................... | H02J 1/108 361/18 |
| 8,340,527 B2 | * | 12/2012 | Elberbaum .......... | G02B 6/3817 398/113 |
| 8,773,040 B2 | * | 7/2014 | Kamiya ............. | H05B 33/0812 315/209 R |
| 8,866,113 B2 | * | 10/2014 | Holland ............... | H04B 10/802 250/551 |

* cited by examiner

*Primary Examiner* — Dinh T Le
(74) *Attorney, Agent, or Firm* — Andrew Viger; Frank D. Cimino

(57) ABSTRACT

An LED input emulator to interface a signal source designed for use with an LED optocoupler, to capacitive or other galvanic isolation circuitry, emulating LED forward and reverse bias voltages. VR reverse blocking circuitry includes MP1 and MP2 PMOS transistors coupled to an emulator anode port, and to emulate LED reverse bias voltage. VF control circuitry includes a variable resistance (MP3) coupled between anode and cathode ports, and a current control circuit coupled to an output node, and to control current through the variable resistance to maintain a desired forward voltage at the output node. In an example embodiment, the VF control circuitry is implemented with an amplifier and a bandgap voltage reference circuit coupled to the output node, generating both reference and feedback voltages input to the amplifier to control the variable resistance.

17 Claims, 3 Drawing Sheets

EMULATION OF LED INPUT CHARACTERISTICS IN BICMOS PROCESS

CROSS-REFERENCE TO RELATED APPLICATIONS

This application claims the benefit of Provisional Application No. 61/951,235, filed Mar. 11, 2014, the entirety of which is hereby incorporated by reference.

BACKGROUND

1. Technical Field

This Patent Document relates generally to providing galvanic isolation between functional blocks of an electrical system, such as isolating a high voltage/power side from low voltage electronics.

2. Related Art

Galvanic isolation is used to prevent current flow (direct conduction path) from high voltage/power side to low voltage components. An example is an isolated driver for a power switching transistor (IGBT or power MOSFET). The low voltage gate driver electronics needs to be galvanically isolated from the power switching transistor.

FIG. 1A illustrates an optocoupler (opto-isolator) that includes and input side LED, and an output side photo transistor. The input LED is driven by input current from transmit electronics.

FIG. 1B illustrates an alternate capacitor based isolator. Capacitor based or transformer based isolators require a dedicated supply. The isolation capacitors allow AC flow, but block direct current, coupling AC signals between circuits at different DC voltages.

Systems originally designed to use opto-based isolators are designed to drive an LED. Substituting capacitor based or transformer based isolators in such systems requires emulating LED input characteristics for compatibility.

While this Background information references an example isolated power switching application, the Disclosure provided in this Patent Document is not limited to such applications.

BRIEF SUMMARY

This Brief Summary is provided as a general introduction to the Disclosure provided by the Detailed Description and Drawings, summarizing some aspects and features of the Disclosure. It is not a complete overview of the Disclosure, and should not be interpreted as identifying key elements or features of the invention, or otherwise characterizing or delimiting the scope of the invention disclosed in this Patent Document.

This disclosure describes apparatus and methods for emulation of LED input characteristics in a BICMOS process, such as for constructing galvanic isolation interfaces that are not based on optocoupling.

According to aspects of the Disclosure, LED input emulation can be used in a system suitable to provide galvanic isolation between a signal source block configured to drive source signals through an LED optocoupler characterized by a forward voltage and a reverse breakdown voltage, and an isolation circuit configured to receive the source signals through the LED input emulator circuit, and communicate the source signals through a galvanic isolation interface that is not based on optocoupling.

An LED input emulator according to aspects of the Disclosure includes emulator anode and emulator cathode ports coupled to the signal source block, and an emulator output node. The LED input emulator can be configured to emulate LED forward voltage VF at the emulator output node, and LED reverse bias voltage VR across the emulator anode/cathode ports. The LED input emulator includes VR reverse blocking circuitry and VF control circuitry. The VR reverse blocking circuitry is coupled between the emulator anode port and both the emulator output node and the emulator cathode port, to emulate the reverse bias voltage VR. The VF control circuitry is coupled to the emulator output node, to control the forward voltage VF at the emulator output node.

The VR reverse blocking circuitry can include MP1 and MP2 PMOS transistors drain-coupled to the emulator anode port, and gate-coupled to the emulator cathode port, with MP1 source-coupled to the emulator output node, and with MP2 source-coupled to the emulator cathode port. The VF control circuitry can include: (a) variable resistance circuitry (such as an MP3 PMOS transistor) coupled between the emulator anode/cathode ports, and configured to provide a variable resistance based on a VF control signal; and (b) current control circuitry coupled to the emulator output node, and configured to generate the VF control signal to control current through the variable resistance circuit based on a voltage at the emulator output node, such that the voltage at the emulator output node is maintained at the forward voltage VF.

According to other aspects of the Disclosure, the current control circuitry can include an amplifier, and reference circuitry coupled to the amplifier non-inverting input that is configured to provide a reference voltage corresponding to the forward voltage VF, and feedback circuitry coupled between the emulator output node and the amplifier inverting input, that is configured to provide a feedback voltage corresponding to the voltage at the emulator output node. The amplifier circuit is operable to generate the VF control signal based on the reference voltage and the feedback voltage. According to other aspects of the Disclosure, the current control circuitry can be implemented with bandgap circuitry, including Q1 and Q2 NPN transistors; and a resistor network coupled to the Q1/Q2 transistors, the Q1/Q2 transistors and the resistor network configured to generate VBE and ΔVBE voltages, such that (a) the amplifier generates the VF control voltage based on VBE and ΔVBE, thereby controlling the current through the variable resistance, and (b) the forward voltage VF corresponds to a bandgap reference voltage that is a function of VBE and ΔVBE.

Other aspects and features of the invention claimed in this Patent Document will be apparent to those skilled in the art from the following Disclosure.

DETAILED DESCRIPTION

This Description and the Drawings constitute a Disclosure of example embodiments and applications that illustrate various features and advantages of an LED input emulator that emulates LED input characteristics.

An objective of the LED input emulation according to aspects of the Disclosure is to emulate an LED input characteristics in a BiCMOS process. Example LED input characteristics include: (a) forward voltage should be less than 1.95V and more than 1.2V for a given range of input current; (b) reverse bias voltage should be at least −5V; and (c) driven by input current. For the example embodiments, a forward voltage of 1.8V is an example design choice.

In brief overview, an LED input emulator can be designed to interface a signal source designed for use with an LED optocoupler, to capacitive or other galvanic isolation circuitry, emulating LED forward voltage VF and reverse bias voltage VR. VR reverse blocking circuitry includes MP1 and MP2 PMOS transistors coupled to an emulator anode port, to emulate LED reverse bias voltage. VF control circuitry includes a variable resistance (MP3) coupled between anode and cathode ports, and a current control circuit coupled to an output node, to control current through the variable resistance to maintain a desired forward voltage at the output node. In an example embodiment, the VF control circuitry is implemented with an amplifier and a bandgap voltage reference circuit coupled to the output node, generating both reference and feedback voltages input to the amplifier to control the variable resistance. An example application is an isolated (capacitive) gate driver for a high voltage MOSFET or IGBT.

Figure 1A:
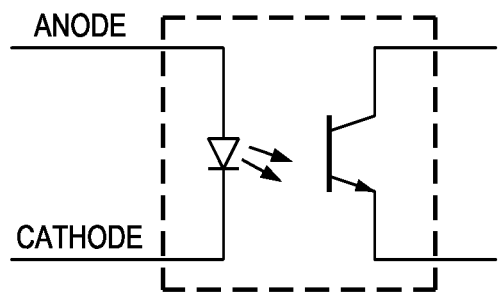
FIGS. 1A AND 1B illustrate LED and capacitive based galvanic isolation configurations.
Figure 1B:
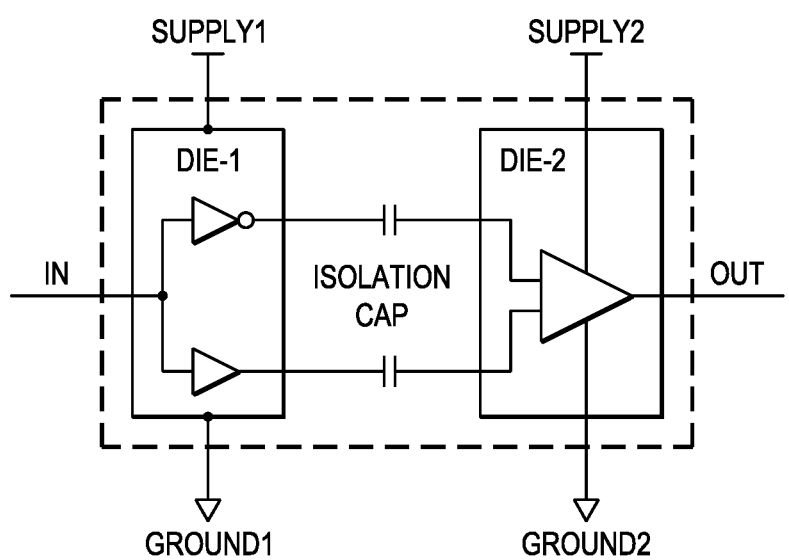
Figure 2:
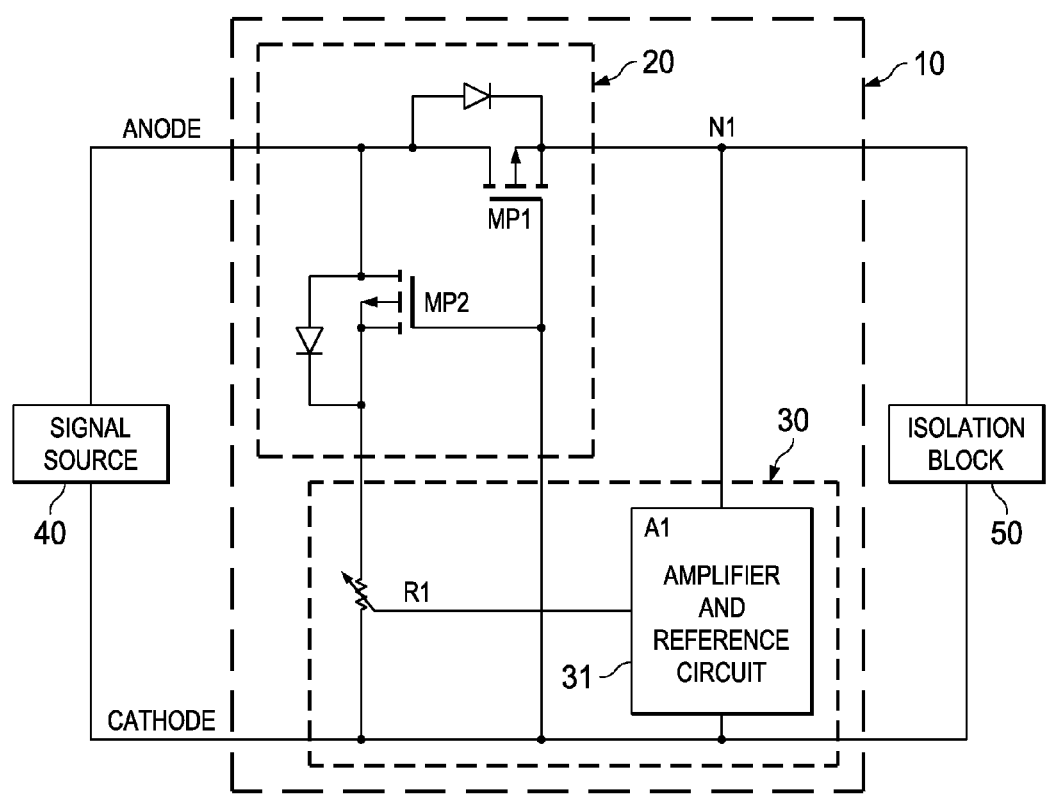
FIG. 2 illustrates an example functional embodiment of an LED input emulator (10) suitable for use in a system providing galvanic isolation between a signal source (40) and an isolation block 50 that is not based on optocoupling, including VR reverse blocking circuitry (MP1 and MP2), and VF control circuitry including a variable resistance (R1).

FIG. 2 illustrates an example functional embodiment of an LED input emulator 10 suitable for use in a system providing galvanic isolation between functional blocks. As illustrated, the example system includes signal source functional block 40, interfaced through LED input emulator 10, to an isolation block 50.

Signal source block 40 is configured to drive source signals through an LED optocoupler that is characterized by a forward voltage VF and a reverse bias voltage VR. Isolation block 50 is configured to receive the source signals through LED input emulator circuit 10, and communicate the source signals through a galvanic isolation interface that is not based on optocoupling. For example, isolation block 50 can be configured to provide capacitor-based isolation.

LED input emulator 10 includes ANODE and CATHODE ports coupled to signal source 40, and an emulator output node N1 coupled to isolation block 50. LED input emulator 10 is configured to emulate LED input characteristics VR and VF in a BICMOS process.

LED input emulator 10 is configured to emulate LED reverse bias voltage VR across the emulator anode/cathode ports, and an LED forward voltage VF at the emulator output node N1. It includes VR reverse blocking circuitry 20 configured to provide LED reverse bias voltage VR, and VF control circuitry 30 configured to control LED forward voltage at N1.

VR reverse blocking circuitry 20 includes first and second PMOS transistors MP1 and MP2, drain-coupled to the emulator ANODE port, and gate-coupled to the emulator CATHODE port. MP1 is source-coupled to the emulator output node N1, and MP2 is source-coupled to the emulator CATHODE port. VR reverse blocking circuitry 20 uses PMOS MP1 and MP2 which acts as reverse blocking diode and thus providing −5V reverse bias voltage.

VF control circuitry 30 controls the emulator output node N1 in forward voltage/operation mode, emulating LED forward voltage. VF control circuitry 30 includes a variable resistance R1, and a current control circuit 31 that controls current through R1. Current control circuit 31, such as an amplifier and voltage reference circuit, is coupled to the emulator output node N1, and configured to generate a VF control signal to maintain the voltage at the emulator output node N1 at a design forward voltage VF within the LED forward voltage range (such as the example 1.8V). Variable resistance R1 is coupled between the emulator anode/cathode ports, and configured to provide a variable resistance based on the VF control signal, thereby controlling current through R1.

VF control circuitry 30 functions to maintain the voltage at the emulator output node N1 at the forward voltage VF. That is, in forward operation, VF control circuitry 30, controls output node N1 coupled to isolation block 50, acting as switch for the forward input current, providing a conductive path between the ANODE port coupled to receive the source signals, and an output node N1 coupled to isolation block 50.

Figure 3:
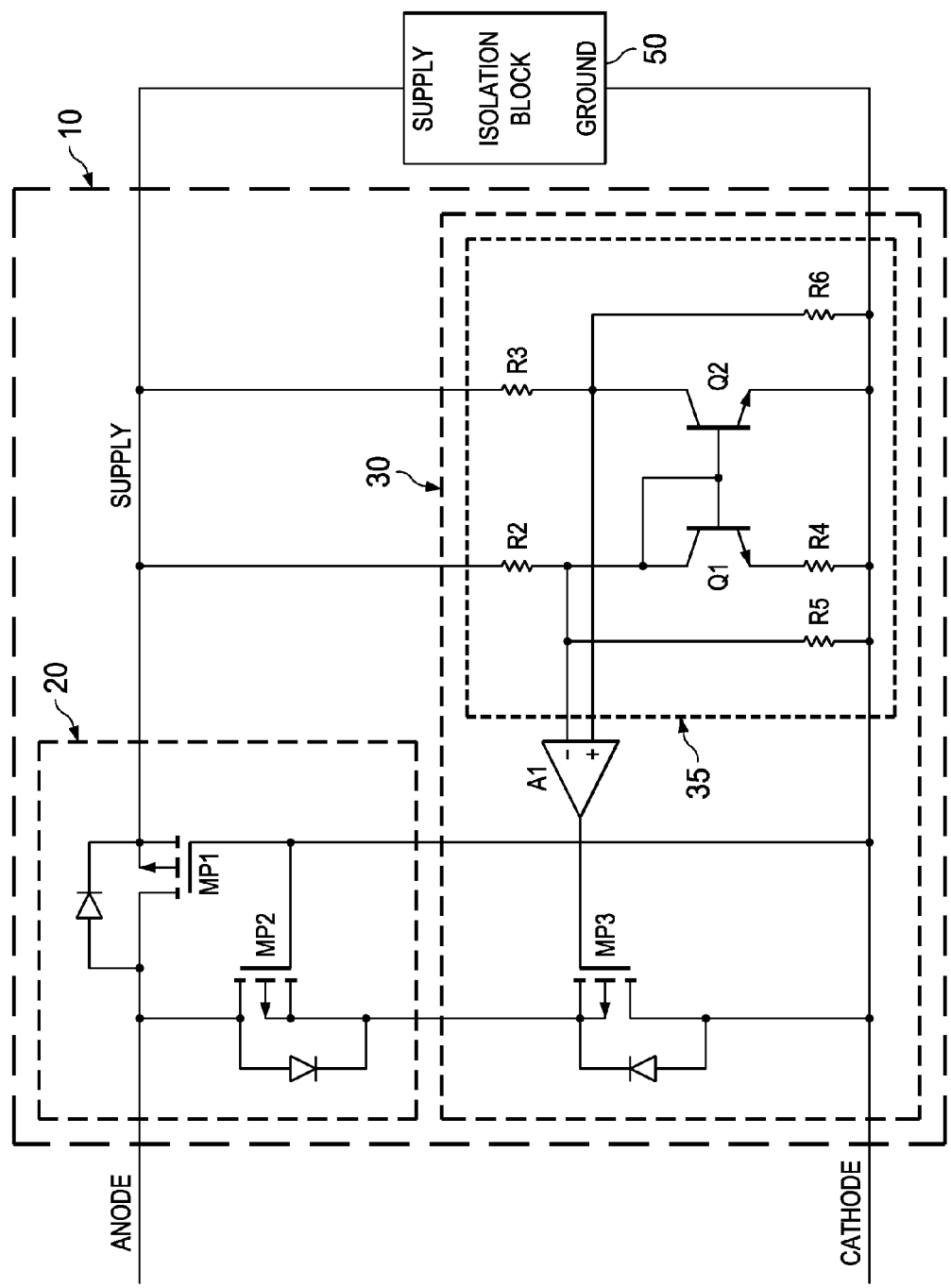
FIG. 3 illustrates an example embodiment of an LED input emulator 10, including VF control circuitry 30 implemented with a variable resistance (MP3) controlled by an amplifier (A1) and bandgap reference/feedback circuitry (35).

FIG. 3 illustrates an example embodiment of an LED input emulator 10, including VF control circuitry 30 implemented with a bandgap voltage reference. For this embodiment, LED input emulator 10 not only emulates the LED input but also provides the supply to the isolation block 50, required to drive isolation related circuits.

VF control circuitry 30 includes a variable resistance implemented with an MP3 PMOS transistor operated as a variable resistor. MP3 is source-coupled to MP2, and drain-coupled to the emulator CATHODE port. MP3 is gate-coupled to receive the VF control signal, which controls the resistance of MP3, and thereby current through MP3.

VF control circuitry 30 includes current control circuitry (FIG. 2, 31) implemented with an amplifier A1 and reference/feedback circuit 35 implemented with bandgap reference circuitry. Amplifier A1 includes inverting and non-inverting inputs coupled to reference/feedback circuitry 35.

Reference/feedback circuit 35 includes reference circuitry and feedback circuitry. Reference circuitry is coupled to the amplifier non-inverting input, and configured to provide a reference voltage corresponding to the design forward voltage VF. Feedback circuitry is coupled between the emulator output node N1 and the inverting input, and configured to provide a feedback voltage corresponding to the voltage at the emulator output node.

Amplifier A1 is operable to generate the VF control signal based on the reference voltage and the feedback voltage, thereby controlling current through the variable resistance MP3.

For this example embodiment, reference/feedback circuitry 35 (reference circuitry and feedback circuitry) is implemented with bandgap reference circuitry. The bandgap reference/feedback circuitry 35 includes Q1 and Q2 NPN transistors, and a resistor network R2/R3/R4 and R5/R6.

The transistors Q1/Q2 and the resistor network are configured to generate bandgap voltages VBE and ΔVBE: VBE is complementary-to-absolute-temperature (CTAT), and ΔVBE is proportional-to-absolute-temperature (PTAT). VBE is generated at the VBE node, and £VBE is generated across R4.

The forward voltage VF at the emulator output node N1 is controlled as a function of the bandgap voltages VBE and ΔVBE. R5/R6 are configured to control VBE CTAT current through the bandgap reference circuitry, adjusting the forward bias voltage VF to a design value in the LED forward voltage range of between 1.2V and 1.95V, such as 1.8V.

Amplifier A1 generates the VF control voltage based on VBE and ΔVBE, thereby controlling the current through the variable resistor MP3. Current through the variable resistor MP3 is controlled to adjust the forward bias voltage VF at the emulator output node N1, which corresponds to a bandgap reference voltage that is a function of VBE and ΔVBE.

The Disclosure provided by this Description and the Figures sets forth example embodiments and applications illustrating aspects and features of the invention, and does not limit the scope of the invention, which is defined by the claims. Known circuits, functions and operations are not described in detail to avoid obscuring the principles and features of the invention. These example embodiments and applications can be used by ordinarily skilled artisans as a basis for modifications, substitutions and alternatives to construct other embodiments, including adaptations for other applications.

The invention claimed is:

1. A system suitable to provide galvanic isolation between functional blocks, comprising:
    a signal source block to drive source signals through an LED optocoupler characterized by a forward voltage and a reverse breakdown voltage;
    an LED input emulator circuit with emulator anode and emulator cathode ports coupled to the signal source block, and an emulator output node, the LED input emulator circuit to emulate a forward voltage VF at the emulator output node, and a reverse bias voltage VR across the emulator anode and cathode ports; and
    an isolation circuit, including a galvanic isolation interface that is not based on optocoupling, coupled to the emulator anode port, through the emulator output node, and to the emulator cathode port, to receive the source signals through the LED input emulator circuit;
    the LED input emulator circuit including:
        VR reverse blocking circuitry coupled between the emulator anode port and both the emulator output node and the emulator cathode port, to emulate the reverse bias voltage VR, including
            MP1 and MP2 PMOS transistors drain-coupled to the emulator anode port, and gate-coupled to the emulator cathode port, with
            MP1 source-coupled to the emulator output node; and
            MP2 source-coupled to the emulator cathode port; and
        VF control circuitry coupled to the emulator output node, to control the forward voltage VF at the emulator output node, including
            a variable resistance circuit coupled between the emulator anode and cathode ports, to provide a variable resistance based on a VF control signal, and
            a current control circuit coupled to the emulator output node, to generate the VF control signal to control current through the variable resistance circuit based on a voltage at the emulator output node to maintain the voltage at the emulator output node at the forward voltage VF.

2. The system of claim 1, wherein the variable resistance circuit comprises:
    an MP3 PMOS transistor source coupled to the MP2 PMOS transistor;
    the MP3 PMOS transistor gate-coupled to the VF control circuit, to receive the VF control signal and control the current through MP3.

3. The system of claim 1, wherein the current control circuit comprises:
    an amplifier including inverting and non-inverting inputs, and an amplifier output;
    reference circuitry coupled to the non-inverting input, to provide a reference voltage corresponding to the forward voltage VF; and
    feedback circuitry coupled between the emulator output node and the inverting input, to provide a feedback voltage corresponding to the voltage at the emulator output node;
    the amplifier circuit to generate the VF control signal at the amplifier output based on the reference voltage and the feedback voltage.

4. The system of claim 3, wherein the reference circuitry and the feedback circuit comprise bandgap circuitry, including:
    Q1 and Q2 NPN transistors; and
    a resistor network coupled to the Q1/Q2 transistors;
    the Q1/Q2 transistors and the resistor network to generate VBE and ΔVBE voltages, such that
        the amplifier generates the VF control voltage based on VBE and ΔVBE, thereby controlling the current through the variable resistance circuit,
        the forward voltage VF corresponds to a bandgap reference voltage that is a function of VBE and ΔVBE.

5. The system of claim 1, wherein the isolation circuit comprises a capacitor-based isolation circuit.

6. An LED input emulator circuit suitable to interface to a galvanic isolation block that is not based on optocoupling, comprising:
    emulator anode and emulator cathode input ports, and an emulator output node, the LED input emulator circuit to emulate an LED forward voltage VF at the emulator output node, and an LED reverse bias voltage VR across the emulator anode and cathode ports;
    VR reverse blocking circuitry coupled between the emulator anode input port and both the emulator output node and the emulator cathode input port, to emulate the LED reverse bias voltage VR, including
        MP1 and MP2 PMOS transistors drain-coupled to the emulator anode input port, and gate-coupled to the emulator cathode input port, with
        MP1 source-coupled to the emulator output node; and
        MP2 source-coupled to the emulator cathode input port; and
    VF control circuitry coupled to the emulator output node, to control the forward voltage VF at the emulator output node, including
        a variable resistance circuit coupled between the emulator anode and cathode input ports, to provide a variable resistance based on a VF control signal, and
        a current control circuit coupled to the emulator output node, to generate the VF control signal to control current through the variable resistance circuit based on a voltage at the emulator output node, to maintain the voltage at the emulator output node at the forward voltage VF.

7. The circuit of claim 6, wherein the anode and cathode input ports are coupleable to a signal source block to drive source signals through an LED optocoupler characterized by a forward voltage VF and a reverse bias voltage VR.

8. The circuit of claim 6, wherein the LED input emulator circuit is integrated with the galvanic isolation block.

9. The circuit of claim 6, wherein the variable resistance circuit comprises:
an MP3 PMOS transistor source coupled to the MP2 PMOS transistor;
the MP3 PMOS transistor gate-coupled to the VF control circuit, to receive the VF control signal and control the current through MP3.

10. The circuit of claim 6, wherein the current control circuit comprises:
an amplifier including inverting and non-inverting inputs, and an amplifier output;
reference circuitry coupled to the non-inverting input, to provide a reference voltage corresponding to the forward voltage VF; and
feedback circuitry coupled between the emulator output node and the inverting input, to provide a feedback voltage corresponding to the voltage at the emulator output node;
the amplifier circuit to generate the VF control signal at the amplifier output based on the reference voltage and the feedback voltage.

11. The circuit of claim 10, wherein the reference circuitry and the feedback circuit comprise bandgap circuitry, including:
Q1 and Q2 NPN transistors; and
a resistor network coupled to the Q1/Q2 transistors;
the Q1/Q2 transistors and the resistor network to generate VBE and ΔVBE voltages, such that
the amplifier generates the VF control voltage based on VBE and ΔVBE, thereby controlling the current through the variable resistance circuit,
the forward voltage VF corresponds to a bandgap reference voltage that is a function of VBE and ΔVBE.

12. The circuit of claim 6, wherein the galvanic isolation block comprises a capacitor-based isolation circuit.

13. A method for interfacing a signal source block to drive source signals through an LED optocoupler characterized by a forward voltage and a reverse breakdown voltage, to a galvanic isolation block that is not based on optocoupling, the method comprising:
emulating a reverse bias voltage VR with reverse blocking circuitry coupled between an emulator anode port and both an emulator output node and an emulator cathode port, including
MP1 and MP2 PMOS transistors drain-coupled to the emulator anode port, and gate-coupled to the emulator cathode port, with
MP1 source-coupled to the emulator output node; and
MP2 source-coupled to the emulator cathode port; and
controlling a forward voltage VF at the emulator output node with VF control circuitry coupled to the emulator output node, including
a variable resistance circuit coupled between the emulator anode and cathode ports, for providing a variable resistance based on a VF control signal, and
a current control circuit coupled to the emulator output node, for generating the VF control signal to control current through the variable resistance circuit based on a voltage at the emulator output node to maintain the voltage at the emulator output node at the forward voltage VF.

14. The method of claim 13, wherein the variable resistance circuit comprises:
an MP3 PMOS transistor source coupled to the MP2 PMOS transistor;
the MP3 PMOS transistor gate-coupled to the VF control circuit, to receive the VF control signal and control the current through MP3.

15. The method of claim 13, wherein the current control circuit comprises:
an amplifier including inverting and non-inverting inputs, and an amplifier output;
reference circuitry coupled to the non-inverting input, to provide a reference voltage corresponding to the forward voltage VF; and
feedback circuitry coupled between the emulator output node and the inverting input, to provide a feedback voltage corresponding to the voltage at the emulator output node;
the amplifier circuit to generate the VF control signal at the amplifier output based on the reference voltage and the feedback voltage.

16. The method of claim 15, wherein the reference circuitry and the feedback circuit comprise bandgap circuitry, including:
Q1 and Q2 NPN transistors; and
a resistor network coupled to the Q1/Q2 transistors;
the Q1/Q2 transistors and the resistor network to generate VBE and ΔVBE voltages, such that
the amplifier generates the VF control voltage based on VBE and ΔVBE, thereby controlling the current through the variable resistance circuit,
the forward voltage VF corresponds to a bandgap reference voltage that is a function of VBE and ΔVBE.

17. The method of claim 13, wherein the galvanic isolation block comprises a capacitor-based isolation circuit.

* * * * *